(12) United States Patent
Danov et al.

(10) Patent No.: US 6,278,226 B1
(45) Date of Patent: Aug. 21, 2001

(54) PIEZO CERAMIC TRANSFORMER AND CIRCUIT USING THE SAME

(75) Inventors: Henry Danov; Young Min Kim; Moon Ho Choi; Byung Hoon Lee; Soon Kil Hong, all of Kyunggi-do (KR)

(73) Assignee: Dong Il Technology Ltd., Kyunggi-do (KR)

( * ) Notice: Subject to any disclaimer, the term of this patent is extended or adjusted under 35 U.S.C. 154(b) by 0 days.

(21) Appl. No.: 09/421,033

(22) Filed: Oct. 20, 1999

(51) Int. Cl.$^7$ ................................................. H01L 41/08
(52) U.S. Cl. ............................................. 310/359; 310/366
(58) Field of Search ................................... 310/358, 359, 310/366, 316.01, 317, 319

(56) References Cited

U.S. PATENT DOCUMENTS

| 5,278,471 | 1/1994 | Uehara et al. | |
|---|---|---|---|
| 5,365,141 | 11/1994 | Kawai et al. | |
| 5,440,195 | * 8/1995 | Ohnishi et al. | 310/359 |
| 5,463,266 | * 10/1995 | Fukuoka et al. | 310/359 |
| 5,504,384 | * 4/1996 | Lee et al. | 310/359 |
| 5,736,807 | * 4/1998 | Hakamata et al. | 310/359 |
| 5,751,092 | * 5/1998 | Abe | 310/359 |
| 5,929,554 | * 7/1999 | Kanayama et al. | 310/359 |
| 5,962,954 | * 10/1999 | Leers et al. | 310/359 |

FOREIGN PATENT DOCUMENTS

| 8-107240 | 4/1990 | (JP) . |
|---|---|---|
| 6-224484 | 8/1994 | (JP) . |

* cited by examiner

Primary Examiner—Mark J. Budd
(74) Attorney, Agent, or Firm—Thomas R. Vigil

(57) ABSTRACT

A piezo ceramic transformer working at a full wave length mode, λ-mode, in accordance with the present invention has a driving region divided into two sections in the center and two generating regions at the end regions of a thin rectangular bar. Two input sections are built into multi-layered structure with multiple internal-electrodes and poled along the thickness direction with polarization in the neighboring layers opposite to each other. Alternating internal electrodes are connected in parallel through two external electrodes in each input section. Polarization in the same layer of two input sections are disposed in the same direction, and two external electrodes of two input sections in the same side of driving region are connected 180 degree out of phase to each other to a driving circuit. Two CCFLs are connected directly to two output electrodes at the end of the piezo ceramic transformer, respectively. Polarization in two output sections is along the length of the piezo ceramic plate, but the respective direction is in opposite way. Alternatively, polarization in the same layer of the two input sections are disposed in opposite direction, and two external electrodes of two input sections in the same side are connected in phase to each other to a driving circuit.

7 Claims, 7 Drawing Sheets

PIEZO CERAMIC TRANSFORMER AND CIRCUIT USING THE SAME

BACKGROUND OF THE INVENTION

1. Field of the Invention

The present invention relates to a piezo ceramic transformer and a circuit which drives two CCFLs(cold cathode fluorescent lamps) and more particularly to a step-up piezo ceramic transformer with two output sections and a circuit which drives two CCFLs for LCD backlight unit, working at a full wavelength vibration mode.

2. Description of the Prior Art

U.S. Pat. No. 2,974,296 discloses a piezo ceramic transformer which was first developed in early 1960s and has regained strong interest recently as a step-up transformer in inverter circuit for CCFL of LCD backlight unit.

Based on the original Rosen type design, several variations of piezo ceramic transformer, which are disclosed in U.S. Pat. Nos. 5,440,195, 5,463,266 and 5,365,141, and Japanese Patent No. 6-224484 and 8-107240, have been developed and applied successfully in inverters for LCD backlight system. Piezo transformer has many advantages compared to conventional magnetic transformer: a low profile, a narrow width, a high efficiency, less EMI, etc. In addition, unique dependence of step- up ratio on load resistance is a perfect match for ignition and regulation of CCFL, i.e. a very high step-up ratio at no load for a start of CCFL and a reduced step-up ratio for regulation of lamp current with a decreased impedance of CCFL after ignition. Most of the commercial application requires a low input voltage and thus input section of piezo transformer is multilayered to further increase step-up ratio for inverters of notebook PC, etc.

Although a single CCFL might be used as a backlight source in LCDs no bigger than 13.3", two or more CCFLs are generally required for bigger LCD than 14" to provide an increased light output and to enhance brightness, especially in LCD monitors. It is possible by increasing working frequency to increase power density of piezo transformer per unit weight, to reduce its size and to increase light efficacy of CCFL, but its working frequency is limited by characteristics of CCFL. Maximum working frequency of CCFL guaranteed by lamp manufacturer is usually no more than 80~90 kHz. In order to further reduce the size, especially thickness and width, of inverters for LCD, it is required to maximize working frequency within the limit and to design a piezo transformer with multiple output electrodes to drive multiple CCFLs.

Most of piezo transformers in the prior arts have only one output electrode and thus it is not possible to drive two CCFLs separately. Two CCFLs might be connected in parallel to a piezo transformer with a single output electrode, but then load impedance becomes half from parallel connection of two CCFLs, which makes it very difficult to design a piezo transformer with a matching output impedance to a load to get a high conversion efficiency.

Piezo transformer with two output electrodes 101 which is working at a half wavelength mode, $\lambda/2$-mode could be built with a driving section in center 103 as shown in FIG. 1, including a generating section 104 and an input electrode 102, but it has the following disadvantages: 1) a full wavelength resonance, $\lambda$-mode is not working due to its geometry of input electrode and thus its working frequency is low, and 2) elemental holding is not stable because it has only a single nodal point at the center.

OBJECTS OF THE INVENTION

An object of the present invention is to provide a piezoceramic transformer working at a full wave length mode, $\lambda$-mode, with two output electrodes each of which drives a CCFL separately.

Another object is to provide a circuit to drive two CCFLs separately with the piezo ceramic transformer invented.

These and other objects will appear upon reading the following specification and claims and upon considering in connection with the attached drawing to which they relate.

SUMMARY OF THE INVENTION

A first piezoceramic transformer in accordance with the present invention comprises a rectangular piezo ceramic plate 210 working at a full wave length mode($\lambda$-mode), which is composed of a driving section and two generating sections 213 and 214, wherein said driving section is located in the middle of said piezo ceramic plate and divided into two input sections 211 and 212, and said two generating sections are located at the ends of said piezo ceramic plate; two sets of multiple internal electrodes 219 and 220 which are built into said input sections 211 and 212 having a multi-layered structure; two external electrodes 215, 216, 217 and 218 for each input section on the surface of said piezo ceramic plate 210 connecting two sets of alternating internal electrodes 219 and 220 in parallel; and output electrodes 221 and 222 which are formed on the ends of two generating sections 213 and 214, wherein each layer of input multi-layered structure is poled along the thickness direction with polarization in the neighboring layers opposite to each other, and polarization in the same layer of said two input sections 211 and 212 is disposed in the same direction, and polarization in two generating sections is along the length of said piezo ceramic plate 210 but the respective direction is in opposite way.

Each of two CCFLs is connected directly to one of two output electrodes formed at the end of the piezo ceramic plate, respectively, and two external electrodes of two input sections on the same side of the piezo ceramic plate are connected 180 degree out of phase to each other to a driving circuit.

In a second piezo ceramic transformer in accordance with the present invention, polarization in the same layer of the two input sections is disposed in the opposite direction, and two external electrodes of two input sections on the same side of the piezo ceramic plate are connected in phase to each other to a driving circuit so as to make electrical connection easy, and all the other features are the same as in the first invention.

The above and other objects, features and advantages of the present invention will become clear from the following description based upon the accompanying drawings which illustrate examples of preferred embodiment of the present invention.

DETAILED DESCRIPTION OF THE PREFERRED EMBODIMENT

Figure 1:
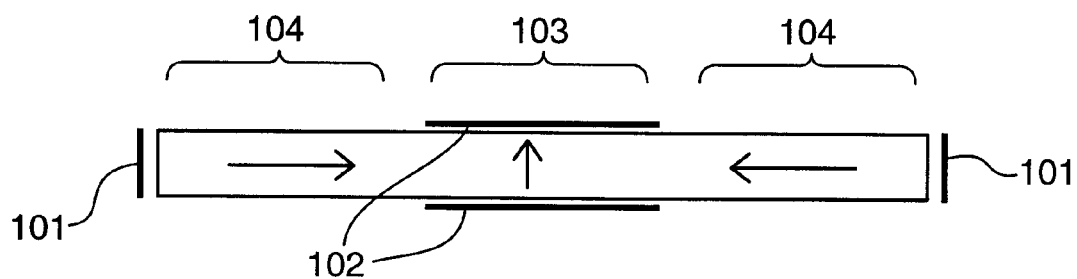
FIG. 1 shows a piezo ceramic transformer with two output electrodes operating at a half wavelength mode, $\lambda/2$-mode.

A piezo ceramic transformer in accordance with the present invention comprises a rectangular piezo ceramic plate 210 composed of a driving section and two generating sections 213 and 214, two sets of multiple internal electrodes 219 and 220, two external electrodes 215, 216, 217 and 218 for each input section, and output electrodes 221 and 222.

A circuit to drive two CCFLs in accordance with the present invention comprises a piezo ceramic transformer of the present invention, two CCFLs, and a driving circuit.

The present invention will be described with reference to the accompanying drawings.

Figure 2A:
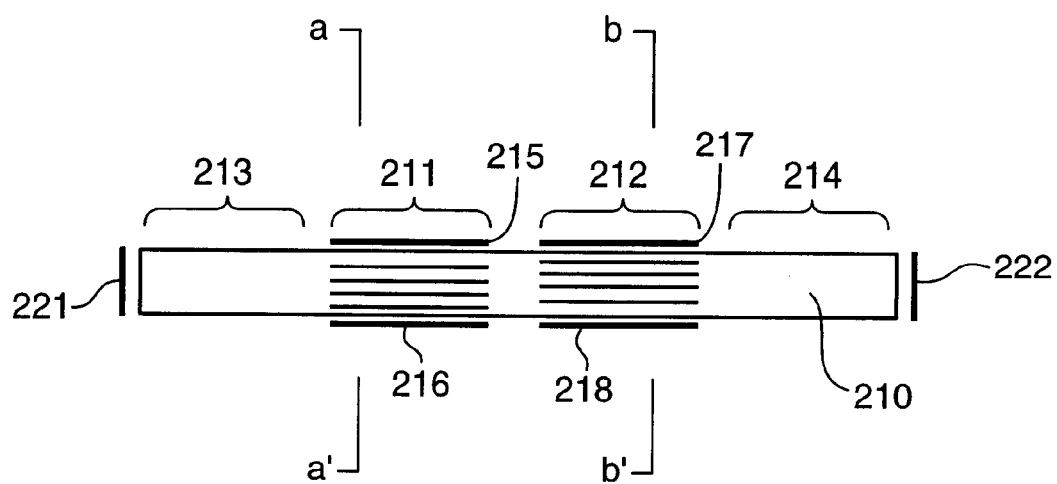
FIG. 2A is a longitudinal view showing a first piezo ceramic transformer according to the present invention.
Figure 2B:
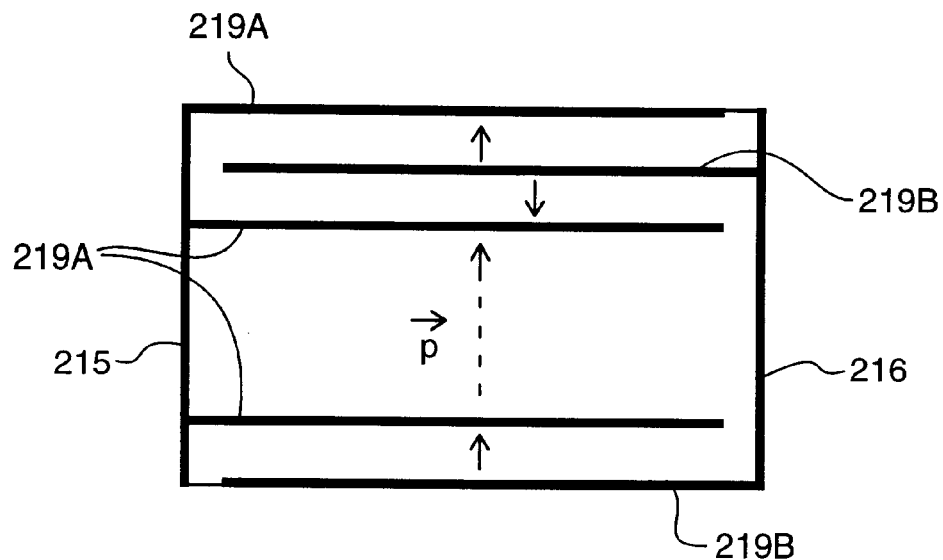
FIG. 2B is a sectional view taken along the line a–a' of FIG. 1A.
Figure 2C:
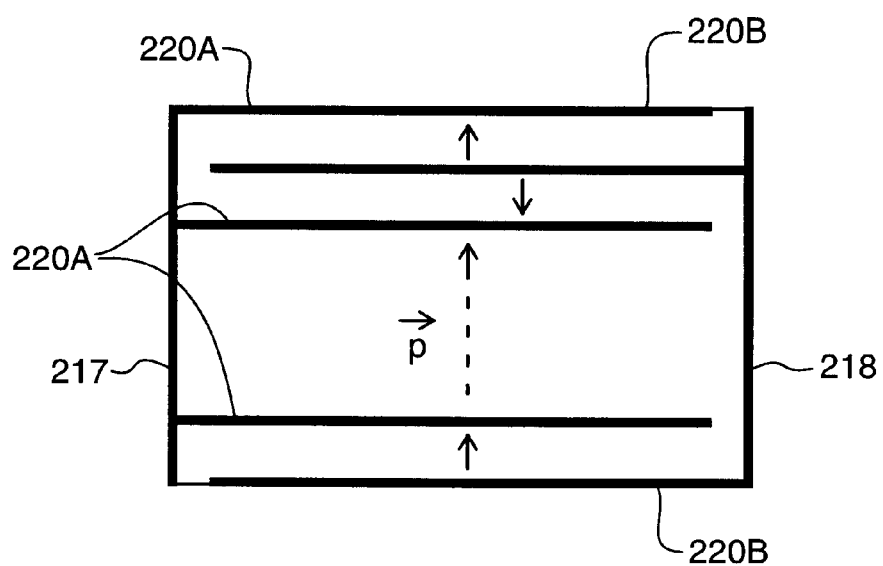
FIG. 2C is a sectional view taken along the line b–b' of FIG. 1A.

FIG. 2A is a longitudinal view showing a first piezo ceramic transformer in accordance with the present invention. FIG. 2B is a sectional view taken along the line a–a' of FIG. 2A. FIG. 2C is a sectional view taken along the line b–b' of FIG. 2A. FIG. 2A shows a piezo ceramic plate 210 with two driving sections 211 and 212 containing multiple internal electrodes 219 and 220, and two generating sections 213 and 214. As shown in FIG. 2B and 2C, alternating internal electrodes in each of the driving sections 219a, 219b, 220a and 220b are connected in parallel through external electrode 215 and 216, 217 and 218, respectively. A pair of output electrodes 221 and 222 are formed on the ends of two generating sections 213 and 214. Internal electrode is made of usually Ag—Pd, Pd or other conductive paste and external electrodes 215, 216, 217 and 218 as well as output electrodes 221 and 222 are usually made of Ag paste. Electrical polarization in the input sections is along the thickness direction but polarization in neighboring layer is opposite to each other as shown in FIG. 2B and FIG. 2C. Polarization in the same layer of the two input sections are disposed in the same direction as shown in FIG. 2B and FIG. 2C. Two output sections are polarized lengthwise but direction in each section is opposite to each other. The length of each input section 211 or 212 can be varied within about ⅜ of the length of piezo plate and each output section 213 or 214 takes the remaining half length of the piezo plate 210.

Figure 3:
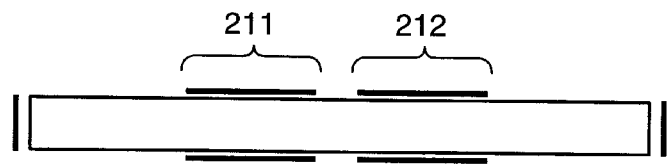
FIG. 3 is a diagram showing a schematic distribution of stress and displacement in the piezo ceramic transformer at a full wavelength resonance, λ-mode.
Figure 3:
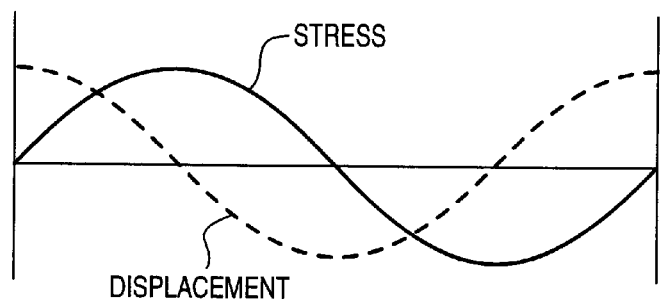
Figure 4:
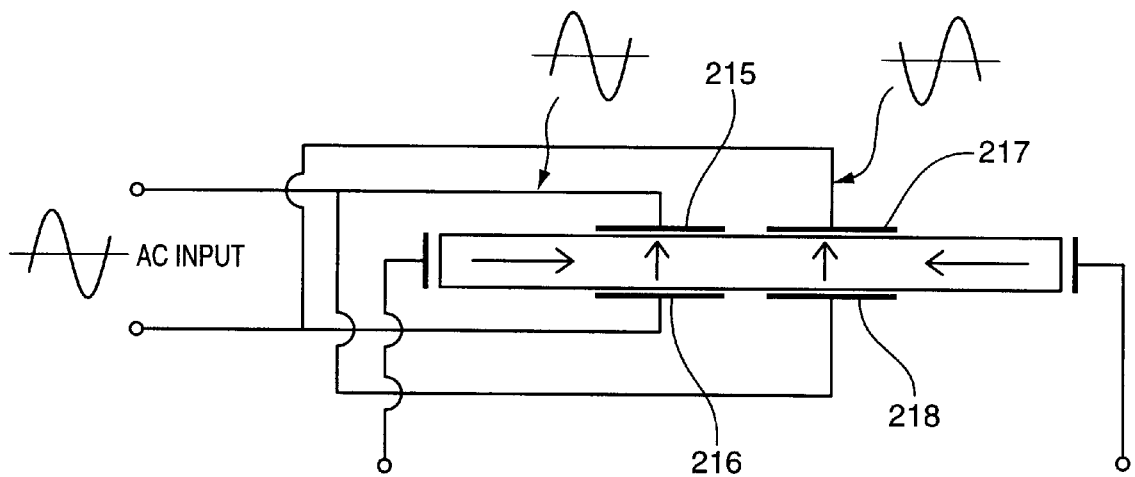
FIG. 4 is a schematic diagram of electrical connection to two input sections of a first piezo ceramic transformer according to the present invention.

FIG. 3 is a schematic diagram of stress and displacement in a piezo plate resonating at a full wavelength mode(λ-mode). We can see easily that two input sections are under opposite stress condition to each other, in other words the input section 211 under compression and the input section 212 under tension or vice versa. If the central input section is formed as one piece in FIG. 1, it does not meet the mechanical conformity for a λ-mode resonance. In a first piezo ceramic transformer of the present invention, λ-mode resonance is activated by dividing the input section into two parts and polarizing the same layer of two input sections in the same direction to each other as shown in FIG. 2B and 2C and further by connecting two external electrodes of two input sections of the same side 215 and 217 or 216 and 218, 180 degree out of phase to each other to a high-frequency input source as shown in FIG. 4. As two nodes exist for a λ-mode resonance as shown in FIG. 3, elemental holding becomes easier and more reliable compared to the design in FIG. 1.

Figure 5:
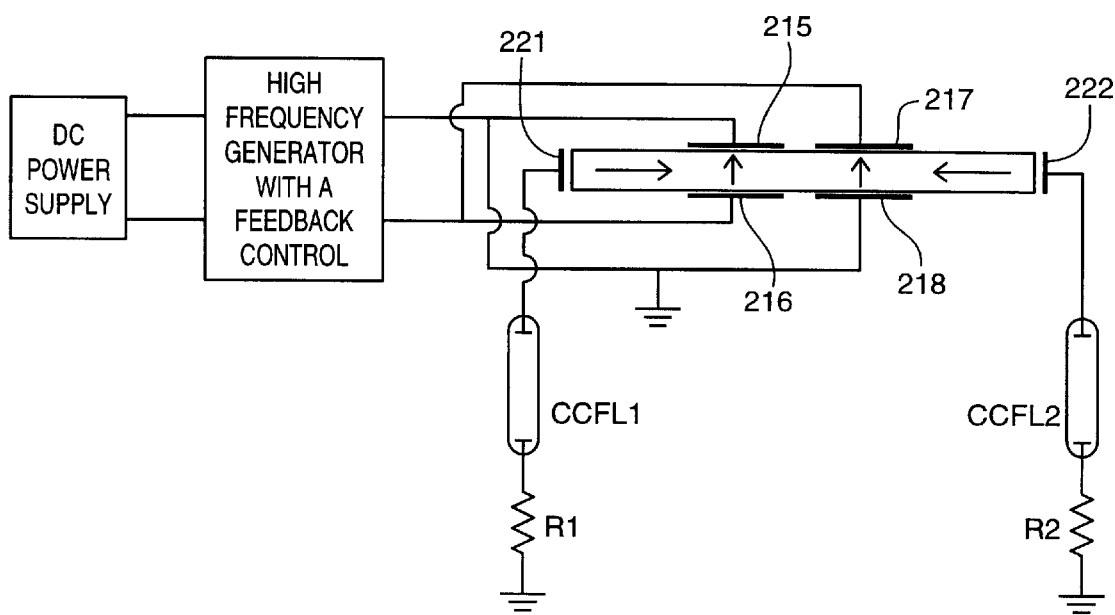
FIG. 5 is a block diagram of application circuit driving two CCFLs according to a first piezo ceramic transformer according to the present invention.

FIG. 5 shows a block diagram of electrical circuit to drive CCFLs with the invented piezo transformer. Input DC voltage is converted to a high frequency input voltage for a longitudinal resonance by a high frequency generating circuit, i.e. a driving circuit which usually made of switching transistors, frequency generating and controlling IC, feedback control circuit for controlling output current, input matching network with inductors, etc. Sinusoidal, high frequency voltage is fed into the input sections 215 and 216, 217 and 218 of the piezo transformer. Two external electrodes 215 and 217 or 216 and 218 are connected 180 degrees out of phase to each other to the driving circuit. One end of a CCFL, CCFL1 or CCFL2, is connected to one of the output electrode 221 or 222, respectively and the other end is connected to the ground through a measuring resistor R1 or R2 for a feedback control.

Figure 6A:
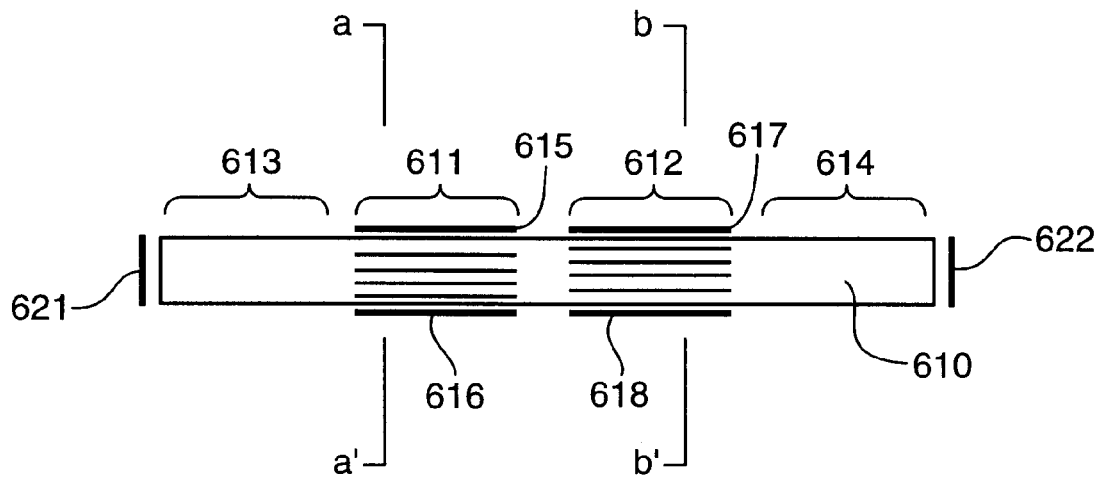
FIG. 6A is a longitudinal view showing a second piezo ceramic transformer according to the present invention.
Figure 6B:
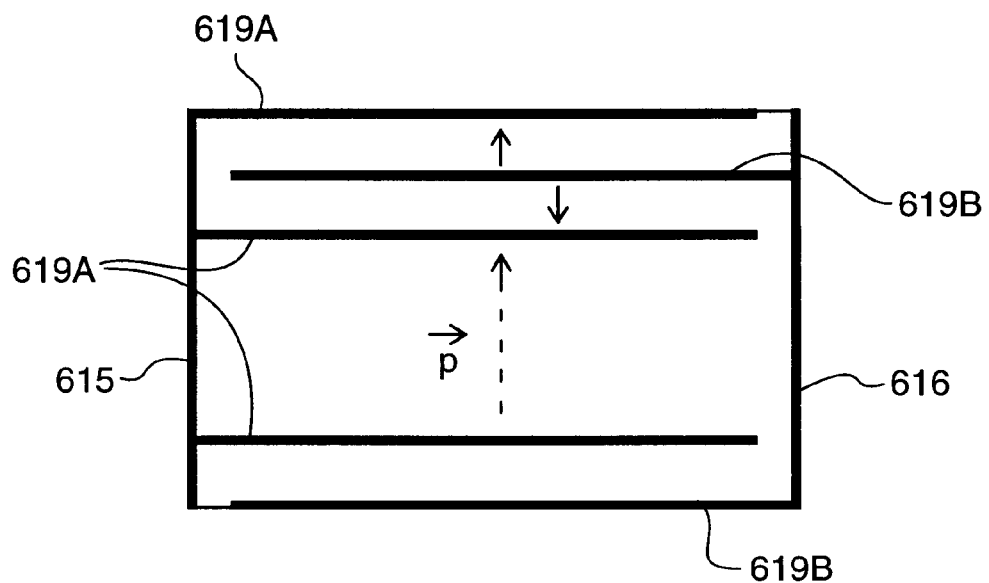
FIG. 6B is a sectional view taken along the line a–a' of FIG. 6A.
Figure 6C:
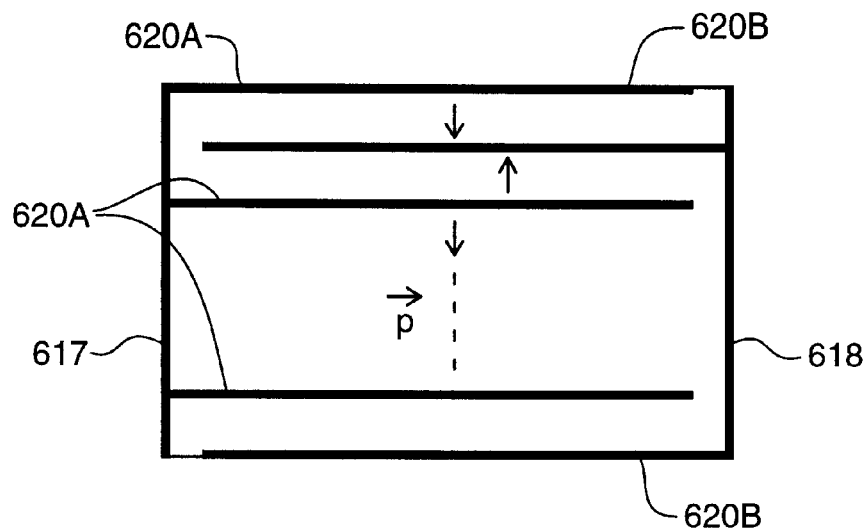
FIG. 6C is a sectional view taken along the line b–b' of FIG. 6A.
Figure 7:
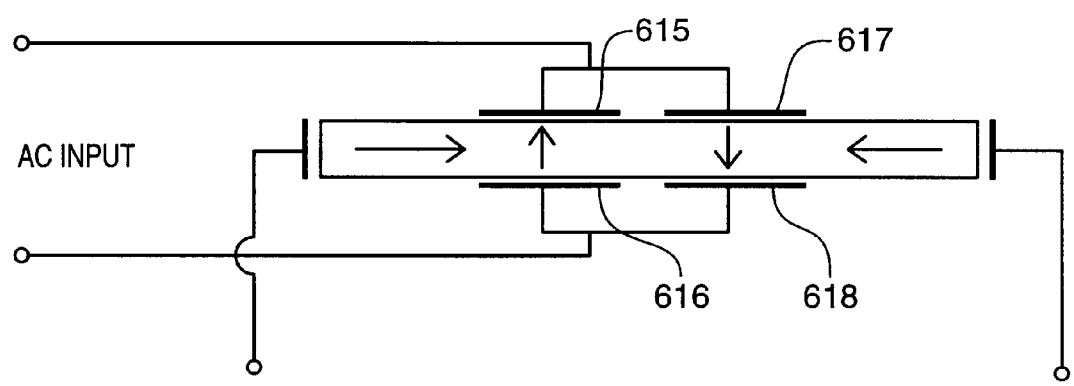
FIG. 7 is a schematic diagram of electrical connection to two input sections according to a second piezo ceramic transformer of the present invention.

FIGS. 6A, 6B and 6C show a piezo transformer according to a second piezo ceramic transformer of the present invention, wherein all the description for a driving section 611 and the others are the same as a driving section 211 and the others in FIG. 2, respectively. It is different from the first invention that the polarization in the same layer of the two input sections 611 and 612 is in opposite direction as shown in the FIG. 6B and 6C. Accordingly, in an application circuit, high frequency input voltage in two input sections 615 and 617 or 616 and 618 is in phase to each other as shown in FIG. 7 to meet mechanical conformity with resonance. With the same polarity of two input external electrodes 615 and 617, 616 and 618 on each side of piezo transformer, electrical connection becomes more convenient to a driving circuit.

EXAMPLE

Figure 8:
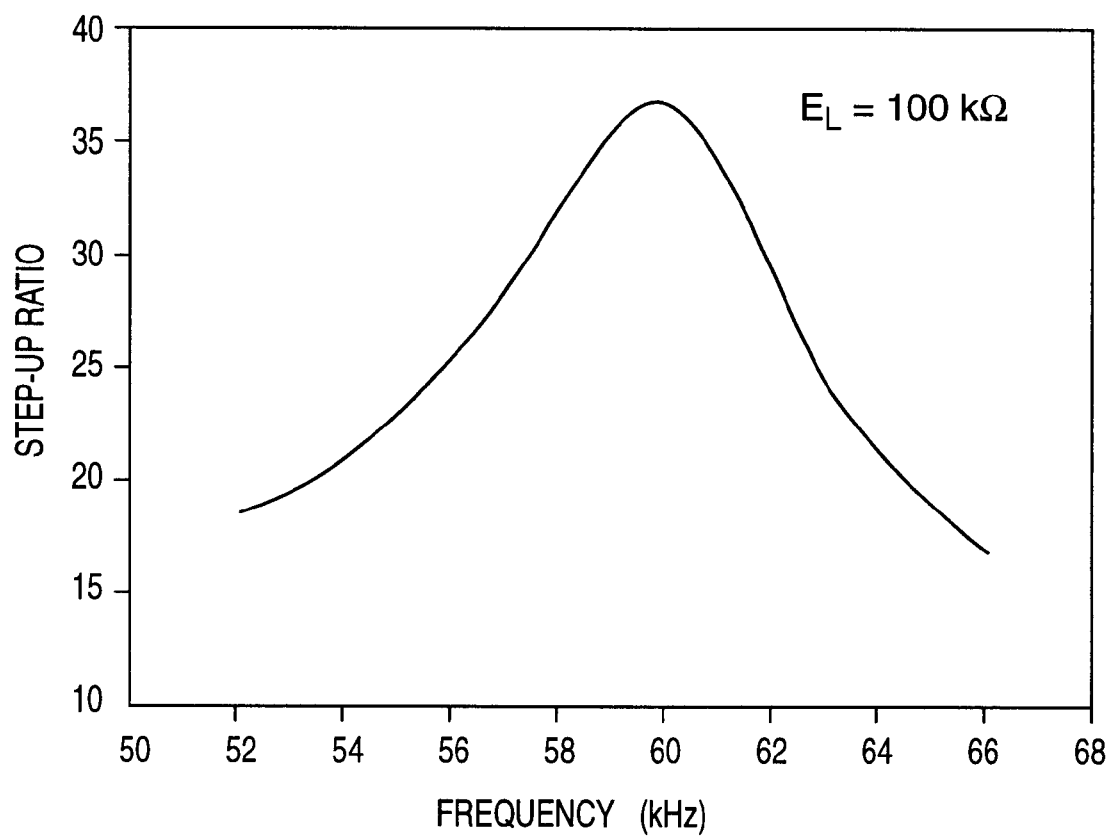
FIG. 8 is a diagram showing step-up ratio as function of frequency of a first piezo transformer according to the present invention at a 100 kΩ load for each section.

A first piezo ceramic transformer according to the present invention was prepared and two CCFLs were driven with a driving circuit. The piezo ceramic transformer was made of PbO—ZrO$_2$—TiO$_2$ solid solution and had a dimension of 56×7.0×2.0 in mm. Input sections had fourteen internal electrodes made of Ag—Pd paste. The piezo ceramic transformer was prepared by means of using multilayer ceramic processing, i.e. by stacking printed green sheets and co-firing stacked green bars. Output electrodes and external electrodes was built with Ag paste. Polarization was done in Silicone oil at a polarization field of 2~4 kV/mm at 130° C. FIG. 8 shows a step-up ratio of piezo transformer made for each section with a load resistance of 100 kΩ. For a resistance load of 100 kΩ, we could get a peak step-up ratio of 35 and an output current of 8 mA, i.e, 6 W for each section. Conversion efficiency was 96% and up. Its resonance frequency at 100 kΩ load was 60 kHz. Two CCFLs of 340 mm in length and 2.5 mm in diameter were connected according to a first piezo ceramic transformer of the present invention, and its lamp current and voltage were measured. We had a lamp current of 8mA and a lamp voltage of 650 Vrms, i.e. 5.2 W for each lamp. Two CCFLs worked stable with a feedback control without jittering or heating of piezo transformer.

What is claimed is:

1. A piezo ceramic transformer comprising:

a rectangular piezo ceramic plate 210 working at a full wave length mode(λ-mode), which is composed of a driving section and two generating sections 213 and 214, wherein said driving section is located in the middle of said piezo ceramic plate and divided into two input sections 211 and 212, and said two generating sections are located at the ends of said piezo ceramic plate;

two sets of multiple internal electrodes 219 and 220 which are built into said input sections 211 and 212 having a multi-layered structure;

two external electrodes 215, 216, 217 and 218 for each input section on the surface of said piezo ceramic plate 210 connecting two sets of alternating internal electrodes 219 and 220 in parallel; and output electrodes 221 and 222 which are formed on the ends of two generating sections 213 and 214, wherein each layer of input multi-layered structure is poled along the thickness direction with polarization in the neighboring layers opposite to each other, and polarization in the same layer of said two input sections 211 and 212 is disposed in the same direction, and polarization in two generating sections is along the length of said piezo ceramic plate 210 but the respective direction is in opposite way.

2. The piezo ceramic transformer as defined in claim 1, wherein each input section has a length up to ⅜ of the whole length of said piezo ceramic transformer.

3. The piezo ceramic transformer as defined in claim 1, wherein protective layers are put on the top and bottom surface of said piezo ceramic plate.

4. A circuit to drive two CCFLs comprising:

said piezo ceramic transformer of claim 1;

two CCFLs in which one end of each CCFL is connected to one of two output electrodes and the other end to the ground through a measuring resistor for a feedback control; and a driving circuit with a feedback control circuit for controlling lamp current, wherein two input external electrodes of input sections on the same side of the piezo ceramic plate are connected 180 degree out of phase to each other to a driving circuit.

5. A piezo ceramic transformer comprising:

a rectangular piezo ceramic plate 210 working at a full wave length mode (λ-mode), which is composed of a driving section and two generating sections 213 and 214, wherein said driving section is located in the middle of said piezo ceramic plate and divided into two input sections 211 and 212, and said two generating sections are located at the ends of said Piero ceramic plate;

two sets of multiple internal electrodes 219 and 220 which are built into said input sections 211 and 212 having a multi-layered structure;

two external electrodes 215, 216, 217 and 218 for each input section on the surface of said Piero ceramic plate 210 connecting two sets of alternating internal electrodes 219 and 220 in parallel;

output electrodes 221 and 222 which are formed on the ends of two generating sections 213 and 214;

two CCFLs in which one end of each CCFL is connected to each of two output electrodes and the other end to the ground through a measuring resistor for a feedback control;

a driving circuit with a feedback control circuit for controlling lamp circuit;

wherein each layer of input multi-layered structure is poled along the thickness direction with polarization in the neighboring layers opposite to each other, and polarization in the same layer of said two input sections 211 and 212 is disposed in opposite direction, and polarization in two generating sections is along the length of said Piero ceramic plate 210 but the respective direction is in opposite way; and two input external electrodes of input sections o the same side of the Piero ceramic plate are connected in phase to a driving circuit.

6. The Piero ceramic transformer as defined in claim 5, wherein each input section has a length up to ⅜ of the whole length of said Piero ceramic transformer.

7. The Piero ceramic transformer as defined in claim 5, wherein protective layers are put on the top and bottom surface of said Piero ceramic plate.

* * * * *

UNITED STATES PATENT AND TRADEMARK OFFICE
CERTIFICATE OF CORRECTION

PATENT NO.   : 6,278,226 B1
DATED        : August 21, 2001
INVENTOR(S)  : Henry Danov, Young Min Kim, Moon Ho Choi, Byung Hoon Lee and Soon Kil Hong It is certified that error appears in the above-identified patent and that said Letters Patent is hereby corrected as shown below:

<u>Column 6,</u>
Lines 12, 18, 36, 39, 41, 43 and 46, "Piero" should be -- piezo --.

Signed and Sealed this

Twenty-third Day of April, 2002

*Attest:*

JAMES E. ROGAN
*Attesting Officer*      *Director of the United States Patent and Trademark Office*

UNITED STATES PATENT AND TRADEMARK OFFICE
CERTIFICATE OF CORRECTION

| | | |
|---|---|---|
| PATENT NO. | : 6,278,226 B1 | Page 1 of 1 |
| DATED | : August 21, 2001 | |
| INVENTOR(S) | : Henry Danov, Young Min Kim, Mcon Ho Choi, Byung Hoon Lee and Soon Kil Hong | |

It is certified that error appears in the above-identified patent and that said Letters Patent is hereby corrected as shown below:

<u>Column 6,</u>
Line 38, "o" should be -- on --;
Line 44, "piero" should be -- piezo --.

Signed and Sealed this

Tenth Day of September, 2002

*Attest:*

JAMES E. ROGAN
*Attesting Officer*     *Director of the United States Patent and Trademark Office*